United States Patent
Pampuch et al.

(10) Patent No.: US 8,435,647 B2
(45) Date of Patent: May 7, 2013

(54) OLED INCLUDING HOLE-CONDUCTING MATERIAL

(75) Inventors: Bjoern Pampuch, Kassel (DE); Herbert F. Boerner, Aachen (DE); Josef Salbeck, Kaufungen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/130,488

(22) PCT Filed: Nov. 18, 2009

(86) PCT No.: PCT/IB2009/055132
§ 371 (c)(1),
(2), (4) Date: May 20, 2011

(87) PCT Pub. No.: WO2010/061315
PCT Pub. Date: Jun. 3, 2010

(65) Prior Publication Data
US 2011/0227054 A1    Sep. 22, 2011

(30) Foreign Application Priority Data

Nov. 26, 2008    (EP) .................... 08169985

(51) Int. Cl.
*H01L 51/54* (2006.01)

(52) U.S. Cl.
USPC .......... 428/690; 428/917; 313/504; 313/505; 313/506; 564/26; 564/426; 564/434

(58) Field of Classification Search .......... 428/690, 428/917; 313/504, 505, 506; 564/26, 426, 564/434; 544/440
See application file for complete search history.

(56) References Cited

U.S. PATENT DOCUMENTS

| | | |
|---|---|---|
| 5,741,921 A | 4/1998 | Kreuder et al. |
| 5,763,636 A | 6/1998 | Kreuder et al. |
| 6,458,476 B1 | 10/2002 | Suzuki et al. |
| 6,645,645 B1 * | 11/2003 | Adachi et al. ............. 428/690 |
| 2003/0168970 A1 | 9/2003 | Tominaga et al. |
| 2004/0170863 A1 * | 9/2004 | Kim et al. ................. 428/690 |
| 2006/0232194 A1 * | 10/2006 | Tung et al. ................ 313/504 |

* cited by examiner

*Primary Examiner* — Jennifer A Chriss
*Assistant Examiner* — Gregory Clark
(74) *Attorney, Agent, or Firm* — Mark Beloborodov; David Zivan

(57) ABSTRACT

The present invention is directed to the field of organic light emitting diode (OLED) electroluminescent devices comprising a novel hole-conducting material having a Spirobixanthen-unit.

8 Claims, No Drawings

OLED INCLUDING HOLE-CONDUCTING MATERIAL

FIELD OF THE INVENTION

The present invention is directed to the field of organic light emitting diode (OLED) electroluminescent devices comprising a light-emitting layer containing an organic metal coordination compound with tailored ligands having a high triplet energy.

BACKGROUND OF THE INVENTION

While organic electroluminescent (EL) devices have been known for over two decades, their performance is generally limited due to several adverse effects. In its simplest form, an organic EL device is comprised of an anode for hole injection, a cathode for electron injection, and an organic medium sandwiched between these electrodes to support charge recombination that yields emission of light. These devices are commonly referred to as organic light-emitting diodes (OLEDs). Today, the most efficient emitters are phosphorescent ones, where the radiative transition is from a triplet state to the ground state. Usually, Iridium or Platinum complexes are used in state-of-the art OLEDs. Normally, between 5% and 15% per weight of the phosphorescent emitter are doped into a material. The use of phosphorescent emitters places a strict requirement on the triplet level of the matrix material.

If the triplet level of the matrix is lower than the triplet level of the emitter, energy is transferred from emitter to matrix, quenching the emission of light. Only if the triplet level of the matrix is higher than the triplet level of the emitter, the energy transfer is inhibited and the resulting OLED exhibits is high quantum efficiency. Quantum efficiency is the ratio of injected charge carrier pairs into the OLED and extracted photons.

For red, yellow and yellow-green emitters this requirement is not difficult to meet, since the triplet level of most matrix materials corresponds to an emission wavelength of 520-550 nm. Only for emitters with wavelengths shorter than 520 nm and especially shorter than 470 nm, there are only few suitable matrix materials.

Since many of the phosphorescent metal complexes conduct electrons well, matrix materials conducting holes are used.

Consequently, there is the constant need for hole-conducting materials with high triplet levels.

SUMMARY OF THE INVENTION

It is therefore an object of the present invention to provide an OLED comprising novel hole-conducting materials with high triplet levels.

This object is solved by an OLED comprising a hole-conducting material with the structure I:

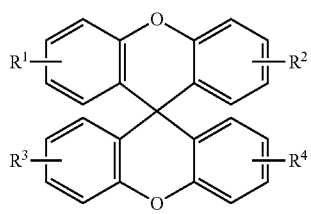

I whereby $R^1$, $R^2$, $R^3$ and $R^4$ are independently selected out of the group comprising the moieties II and III:

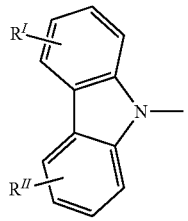

II

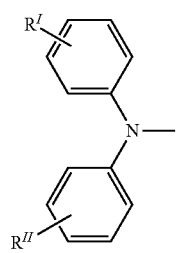

III whereby each $R^I$, $R^{II}$ is independently selected out of the group comprising hydrogen, alkyl, alkoxy, halogenalkyl, cycloalkyl, heterocycloalkyl, aryl, heteroaryl.

These materials have a surprisingly high triplet levels as will be shown later on. It is well known from the state of the art, that matrix materials with such triplet levels can be used for blue phosphorescent emitters up to about an emission wavelength of 460 nm

GENERIC GROUP DEFINITION

Throughout the description and claims generic groups have been used, for example alkyl, alkoxy, aryl. Unless otherwise specified the following are preferred groups that may be applied to generic groups found within compounds disclosed herein:

alkyl: linear and branched C1-C8-alkyl,
cycloalkyl: C3-C8-cycloalkyl,
alkoxy: C1-C6-alkoxy,
aryl: selected from homoaromatic compounds having a molecular weight under 300,
heteroaryl: selected from the group consisting of: pyridinyl; pyrimidinyl; pyrazinyl; triazolyl; pyridazinyl; 1,3,5-triazinyl; quinolinyl; isoquinolinyl; quinoxalinyl; imidazolyl; pyrazolyl; benzimidazolyl; thiazolyl; oxazolidinyl; pyrrolyl; carbazolyl; indolyl; and isoindolyl, wherein the heteroaryl may be connected to the compound via any atom in the ring of the selected heteroaryl,
heterocycloalkyl: selected from the group consisting of: pyrrolinyl; pyrrolidinyl; morpholinyl; piperidinyl; piperazinyl; hexamethylene imine; 1,4-piperazinyl; tetrahydrothiophenyl; tetrahydrofuranyl; 1,4,7-triazacyclononanyl; 1,4,8,11-tetraazacyclotetradecanyl; 1,4,7,10,13-pentaazacyclopentadecanyl; 1,4-diaza-7-thiacyclononanyl; 1,4-diaza-7-oxa-cyclononanyl; 1,4,7,10-tetraazacyclododecanyl; 1,4-dioxanyl; 1,4,7-trithiacyclononanyl; tetrahydropyranyl; and oxazolidinyl, wherein the heterocycloalkyl may be connected to the compound via any atom in the ring of the selected heterocycloalkyl,
halogenalkyl: selected from the group consisting of mono, di, tri-, poly and perhalogenated linear and branched C1-C8-alkyl Unless otherwise specified the following are more preferred group restrictions that may be applied to groups found within compounds disclosed herein:

alkyl: linear and branched C1-C6-alkyl,
cycloalkyl: C6-C8-cycloalkyl,
alkoxy: C1-C4-alkoxy,
aryl: selected from group consisting of: phenyl; biphenyl; naphthalenyl; anthracenyl; and phenanthrenyl,
heteroaryl: selected from the group consisting of: pyridinyl; pyrimidinyl; quinolinyl; pyrazolyl; triazolyl; isoquinolinyl; imidazolyl; and oxazolidinyl, wherein the heteroaryl may be connected to the compound via any atom in the ring of the selected heteroaryl, heteroarylene: selected from the group consisting of: pyridin 2,3-diyl; pyridin-2,4-diyl; pyridin-2,6-diyl; pyridin-3,5-diyl; quinolin-2,3-diyl; quinolin-2,4-diyl; isoquinolin-1,3-diyl; isoquinolin-1,4-diyl; pyrazol-3,5-diyl; and imidazole-2,4-diyl, According to a preferred embodiment of the present invention at least one of the $R^1$, $R^2$, $R^3$ and $R^4$ is in para-Position with respect to the oxygen. This has been shown to furthermore increase the beneficial properties of the material for a wide range of applications within the present invention.

According to a preferred embodiment of the present invention, $R^1=R^2$ and/or $R^3=R^4$; more preferred $R^1=R^2=R^3=R^4$. This has been shown to furthermore increase the beneficial properties of the material for a wide range of applications within the present invention.

According to a preferred embodiment of the present invention, at least one of the $R^I$, $R^{II}$ is in para-Position with respect to the nitrogen. This has been shown to furthermore increase the beneficial properties of the material for a wide range of applications within the present invention.

According to a preferred embodiment of the present invention, $R^I$, $R^{II}$ are independently selected out of the group comprising methyl, ethyl, propyl, isopropyl, butyl and tert.-butyl. This has been shown to furthermore increase the beneficial properties of the material for a wide range of applications within the present invention, especially in respect to the solubility of the material in various solvents.

According to a preferred embodiment of the present invention, the inventive compound I is used to block triplet exciton diffusion from one part of the OLED to another part of the OLED.

The inventive compounds can e.g. be made from Spirobixanthen, which is—amongst other references—feasible according to R. G. Clarkson, M. Gomberg, J. Am. Chem. Soc. 1930, 52, 2887 (2881-2891) by
electrophilic and/or radicalic halogenation and
Hartwig-Buchwald amination using a palladium-catalyst and/or Ullman-reaction type amination using copper.

A preferred lighting unit according to the present invention contains an OLED device as described above and can be used in household applications, shop lighting, home lighting, accent lighting, spot lighting, theater lighting, fiber-optics applications, projection systems, self-lit displays, medical lighting applications, pixelated displays, segmented displays, warning signs, indicator signs, decorative lighting, etc.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, features, characteristics and advantages of the object of the invention are disclosed in the subclaims, the figures and the following description of the respective figures and examples, which—in an exemplary fashion— show several preferred embodiments of an OLED according to the invention.

DETAILED DESCRIPTION OF EMBODIMENTS

Example I

Example I refers to 2,2',7,7'-Tetra(3,6-Di-methyl-carbazol-9-yl)-9,9'-spirobixanthen which has the following structure:

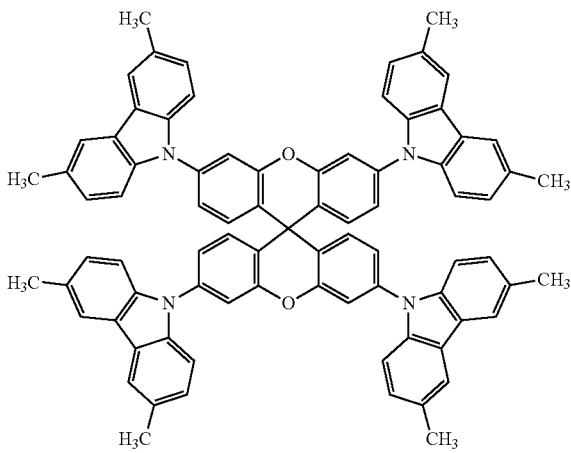

It can be made from 2,2',7,7'-Tetrajod-9,9'-spirobixanthene (accessible from Spirobixanthene by electrophilic iodination) and 3,6-Di-methyl-9H-carbazol via Hartwig-Buchwald-amination and has a triplet level of 435 nm Example II refers to 2,2',7,7'-Tetra(3,6-Di-tert-butyl-carbazol-9-yl)-9,9'-spirobixanthen which has the following structure:

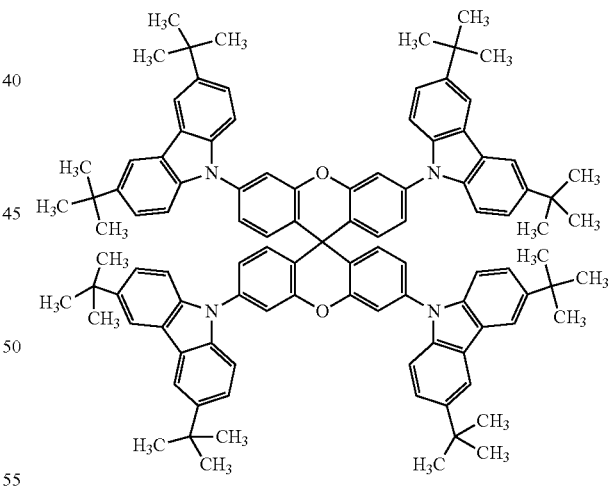

It can be made as Example I (using a different carbazole) and has a triplet level of
436 nm.

The inventive materials as described described can be used in two ways: in emitting layer(s) as matrix materials (usually these layers are doped with phosphorescent emitters) or as triplet exciton blocking layers. A typical structure of an OLED is as follows:

Anode—ITO 120 nm/hole injection layer, 10 nm/hole transport layer 30 nm/emitter layer 30 nm/hole blocking layer 10 nm/electron transport layer 40 nm/electron injection layer 1 nm/cathode—Al 100 nm. Here, the materials with high triplet levels are used in two layers:

- in the emitting layer, being doped with a phosphorescent emitter in weight percentages of ≧1% to ≦50%, preferable between ≧5% and ≦20%, more preferable between ≧5% and ≦15%.
- in the hole transport layer to block the diffusion of triplet excitons out of the emission zone.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. OLED comprising at least one layer comprising compound I including a substitution with $R^1$, $R^2$, $R^3$ and $R^4$:

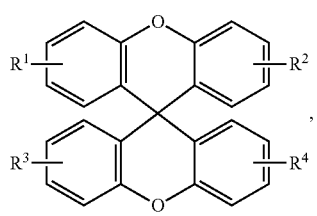

I wherein the substitution is implemented in at least one of the 2, 2', 7 or 7' positions of the compound I and wherein $R^1$, $R^2$, $R^3$ and $R^4$ are independently selected from the group consisting of the moieties II and III:

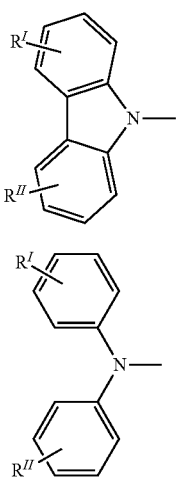

II

III wherein each $R^I$, $R^{II}$ is independently selected from the group consisting of hydrogen, alkyl, halogenalkyl, cycloalkyl, aryl, heteroaryl, wherein a phosphorescent emitting material is doped into this layer in a weight concentration between 1% and 50%.

2. OLED according to claim 1, wherein $R^1$=$R^2$ and/or $R^3$=$R^4$.

3. OLED according to claim 1, wherein $R^1$=$R^2$=$R^3$=$R^4$.

4. OLED according to claim 1, wherein at least one of the $R^I$, $R^{II}$ is in para-Position with respect to the nitrogen.

5. OLED according to claim 1, wherein $R^I$, $R^{II}$ are independently selected from the group comprising methyl, ethyl, propyl, isopropyl, butyl and tert.-butyl.

6. OLED according to any one of claims 1 to 5, wherein the compound I blocks triplet exciton diffusion from one part of the OLED to another part of the OLED.

7. OLED according to claim 1, wherein the compound I is used in at least one emitting layer as matrix material.

8. OLED comprising at least one layer comprising: compound I

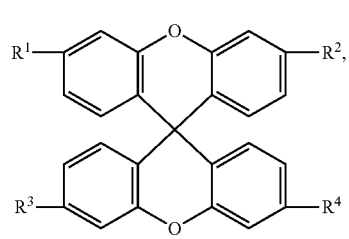

I wherein $R^1$, $R^2$, $R^3$ and $R^4$ are independently selected from the group consisting of the moieties II and III:

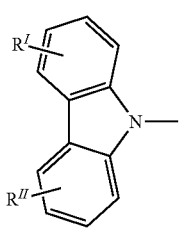

II

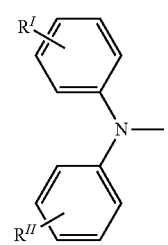

III wherein each $R^I$, $R^{II}$ is independently selected from the group consisting of hydrogen, alkyl, halogenalkyl, cycloalkyl, aryl, heteroaryl, wherein a phosphorescent emitting material is doped into this layer in a weight concentration between 1% and 50%.

* * * * *